United States Patent
Kim

(10) Patent No.: US 8,192,188 B2
(45) Date of Patent: Jun. 5, 2012

(54) APPARATUS OF ENCAPSULATING DISPLAY PANEL AND METHOD OF MANUFACTURING ORGANIC LIGHT EMITTING DISPLAY DEVICE USING THE SAME

(75) Inventor: Ki-Chul Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 636 days.

(21) Appl. No.: 12/222,047

(22) Filed: Jul. 31, 2008

(65) Prior Publication Data

US 2009/0068917 A1 Mar. 12, 2009

(30) Foreign Application Priority Data

Sep. 12, 2007 (KR) .......................... 10-2007-0092647

(51) Int. Cl.
B05C 1/00 (2006.01)
B29C 70/74 (2006.01)

(52) U.S. Cl. ........ 425/110; 118/200; 118/255; 118/256; 425/174.4

(58) Field of Classification Search .................. 425/110, 425/127, 174.4; 118/200, 204, 216, 255, 118/256; 15/236.06
See application file for complete search history.

(56) References Cited

U.S. PATENT DOCUMENTS

| | | | | |
|---|---|---|---|---|
| 878,293 A * | 2/1908 | Kadan | ................. | 33/41.4 |
| 3,566,430 A * | 3/1971 | Young | ................. | 15/236.06 |
| 4,861,251 A * | 8/1989 | Moitzger | ................. | 425/116 |
| 4,946,708 A * | 8/1990 | Habich et al. | ................. | 118/255 |
| 5,509,167 A * | 4/1996 | Wilson | ................. | 15/236.06 |
| 5,586,357 A * | 12/1996 | Kosakowski et al. | ...... | 15/236.06 |
| 5,686,226 A * | 11/1997 | Groman et al. | ................. | 430/325 |
| 5,720,071 A * | 2/1998 | Hall | ................. | 15/236.06 |
| 5,909,839 A * | 6/1999 | Belke et al. | ................. | 228/248.1 |
| 2007/0069422 A1* | 3/2007 | Bandoh | ................. | 264/272.11 |
| 2007/0170839 A1* | 7/2007 | Choi et al. | ................. | 313/500 |
| 2009/0035531 A1* | 2/2009 | Ng et al. | ................. | 118/200 |

FOREIGN PATENT DOCUMENTS

| | | | |
|---|---|---|---|
| JP | 10334805 A | * | 12/1998 |
| JP | 2000-133444 | | 5/2000 |
| JP | 2002-318547 | | 10/2002 |
| KR | 10-2000-0075682 | | 12/2000 |
| KR | 10-2003-0084972 | | 11/2003 |
| KR | 10-2006-0042679 | | 5/2006 |
| KR | 10-2007-0077010 | | 7/2007 |

OTHER PUBLICATIONS

Office action from the Korean Intellectual Property Office issued in Applicant's corresponding Korean Patent Application No. 10-2007-0092647 dated Oct. 17, 2008, (No translation).

* cited by examiner

Primary Examiner — Robert B Davis
(74) Attorney, Agent, or Firm — Robert E. Bushnell, Esq.

(57) ABSTRACT

An encapsulation apparatus capable of securely sealing a gap of a display panel and improving intensity of the display panel, and a method of manufacturing an organic light emitting display device using the encapsulation apparatus are taught. The encapsulation apparatus includes an injection port having tapered projecting edges formed in both sides of one end the injection port, and injecting a reinforcing material into a gap of a display panel in a dual surface contact manner, the first substrate and the second substrate being attached to each other using a sealant; and a supporter coupled to the injection port and supporting the injection port.

10 Claims, 6 Drawing Sheets

APPARATUS OF ENCAPSULATING DISPLAY PANEL AND METHOD OF MANUFACTURING ORGANIC LIGHT EMITTING DISPLAY DEVICE USING THE SAME

CLAIM OF PRIORITY

This application makes reference to, incorporates the same herein, and claims all benefits accruing under 35 U.S.C. §119 from an application for APPARATUS OF ENCAPSULATING DISPLAY PANEL AND METHOD OF MANUFACTURING ORGANIC LIGHT EMITTING DISPLAY USING THE SAME earlier filed in the Korean Intellectual Property Office on 12 Sep. 2007 and there duly assigned Serial No. 10-2007-0092647.

BACKGROUND OF THE INVENTION

1. Field of the Invention

The present invention relates to a process and an apparatus used in the process for encapsulating a flat panel display device, and more particularly to, an apparatus for encapsulating a display panel capable of hermetically sealing a gap of the display panel and improving strength of the display panel, and a method of manufacturing an organic light emitting display device.

2. Description of The Related Art

An organic light emitting display device is one of flat panel displays, and generally includes two electrodes facing each other and spaced apart from each other, and an organic light emitting layer disposed between these two electrodes. When a voltage is applied to both of these two electrodes, electrons injected into one electrode and holes injected into the other electrode are combined in the organic light emitting layer. Here, molecules of the light emitting layer are excited by their combination, and then releases energy as the light, the energy being emitted while returning to a ground state. The organic light emitting display device has excellent visibility, and may be manufactured in a light-weight and thin configuration, and may be driven by a lower voltage, therefore, an increasing public attention has been attracted as the next-generation display device.

The organic light emitting display, however, has a problem that it may be easily deteriorated when the moisture is penetrated into organic matters constituting the organic light emitting layer.

In order to solve these and other related problems regarding the organic light emitting display device, a moisture-absorbing agent may be installed inside of the display device. The method using a moisture-absorbing agent however has a limitation to remove the moisture penetrated into the organic light emitting diode, and it is difficult to mass produce the display device due to the low durability and reliability of the display device. In addition, a method where a moisture-absorbing agent is mounted in the form of powder is complicated, and the costs of materials and processes are therefore increased, thickness of the display device is increased, and it is difficult to apply to the top emission type device. Also, a method of coating an encapsulation substrate with a moisture-absorbing agent has problems that outgassing phenomenon is caused during the sintering process, and therefore an adhesive force between a seal and a substrate may be undesirably decreased and thus the organic light emitting diode may be easily exposed to moisture.

In order to solve the above stated problems regarding the organic light emitting display device, a method of forming a side wall of a frit to seal an organic light emitting diode may be used.

The organic light emitting display device that is coated and sealed with a frit, however, still has limitations in the aspect of completely preventing the penetration of moisture. In particular, because the frit may be easily broken when external impacts are applied to the frit, stress converges to an adhesion surface of the frit and the substrate, and the frit and the encapsulation substrate, therefore, cracks may be generated from the adhesion surface, and be spread into the entire substrate.

SUMMARY OF THE INVENTION

It is therefore an object of the present invention to provide an improved apparatus for encapsulating a display panel capable in order to overcome the disadvantages as stated above, such as the penetration of moisture.

It is another object of the present invention to provide an encapsulation apparatus capable of effectively installing a reinforcing material embracing a seal agent of a display panel.

It is still another object of the present invention to provide a method of manufacturing an organic light emitting display device using the encapsulation apparatus capable of improving luminous efficiency and impact resistance of the organic light emitting display.

In one embodiment of the present invention, an encapsulation apparatus includes an injection part having tapered projecting edges formed in one end thereof and injecting a reinforcing material into a gap between a first substrate and a second substrate of a display panel, the first substrate and the second substrate being attached to each other using a sealant; and a supporter coupled to the injection part and thus supporting the injection part.

Preferably, the injection part has a recess between the projecting edges.

The encapsulation apparatus may further include a body being coupled to the injection part and coupling the injection part to the supporter in an attachable/detachable manner.

In another embodiment of the present invention, a method of manufacturing an organic light emitting display device having a first substrate having an organic light emitting diode installed therein and a second substrate for encapsulating a pixel region of the first substrate, contemplates adhering the second substrate to the first substrate using a sealant; immersing an injection part of an encapsulation apparatus in a liquid reinforcing material, and taking the injection part out of the liquid reinforcing material, with the injection part having tapered projecting edges formed in one end of the injection part; disposing the reinforcing material in a gap of a display panel, with the reinforcing material being disposed on the projecting edges and the display panel being composed of the adhered substrates; and curing the reinforcing material with which the gap is filled.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
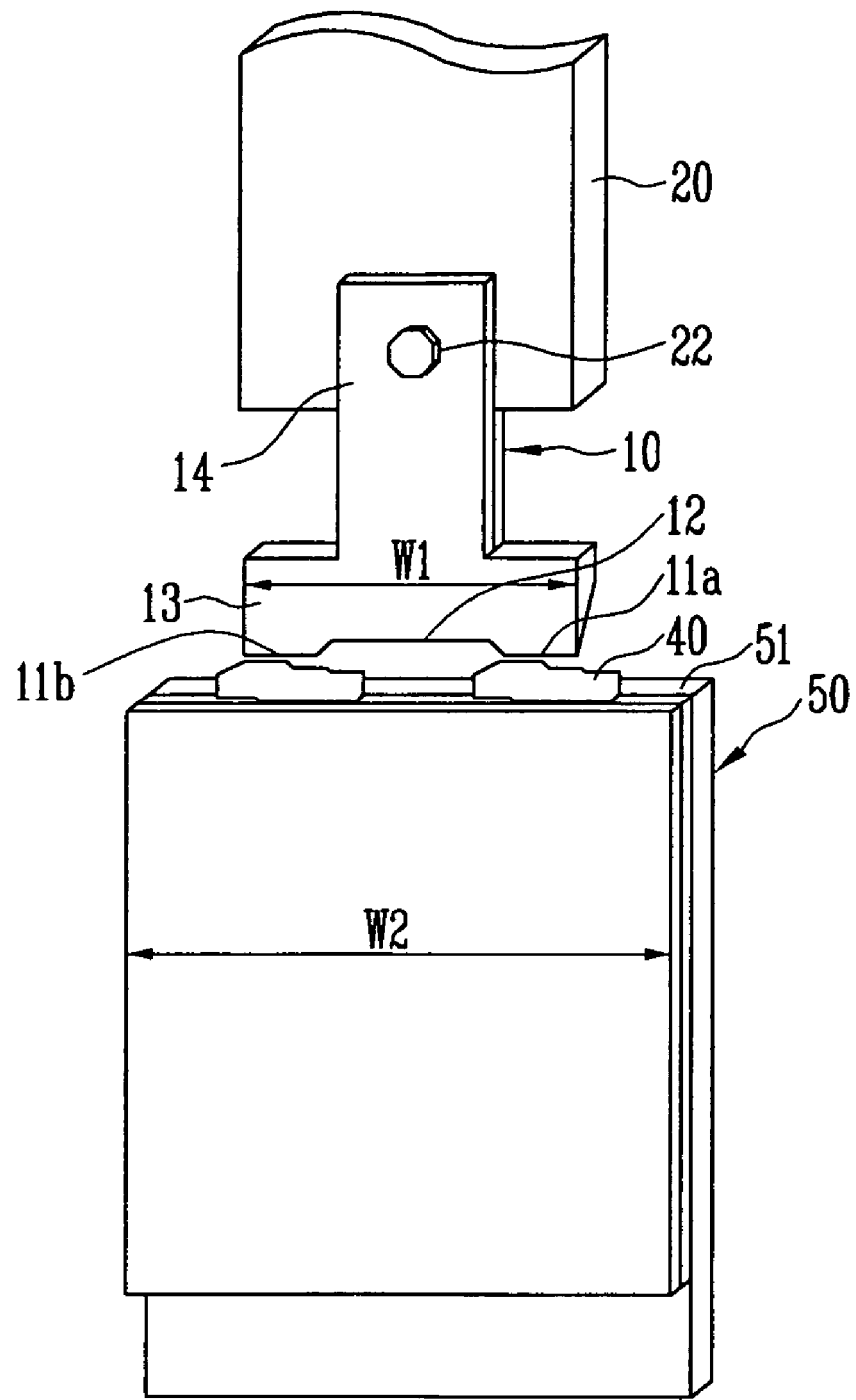
FIG. 1A is a perspective view showing an encapsulation apparatus constructed as an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it may be directly on the another element or be indirectly on the another element with one or more intervening elements interposed therebetween. Also, when an element is referred to as being "connected to" another element, it may be directly connected to the another element or be indirectly connected to the another element with one or more intervening elements interposed therebetween. Hereinafter, like reference numerals refer to like elements.

Hereinafter, exemplary embodiments of the present invention will be described in details with reference to the accompanying drawings. For convenience, in these exemplary embodiments of the present invention, the term "substrate" unit a substrate including an organic light emitting diode, the term "evaporation substrate" unit a substrate which is a base material having an organic light emitting diode formed thereon. And, a display panel commonly refers to a panel in which the substrate (the substrate including an organic light emitting diode) and the encapsulation substrate for encapsulating at least some region of the substrate are adhered to each other by a sealing agent (i.e., a sealant) such as a frit.

FIG. 1A is a perspective view showing an encapsulation apparatus constructed as an exemplary embodiment of the present invention.

Referring to FIG. 1A, the encapsulation apparatus includes an injection part 10 and a supporter 20, and a reinforcing material 40 is injected into a gap on a side surface of a display panel 50 in a dual surface contact manner. Here, the dual surface contact manner refers to a manner of filling a line-shaped gap with two streams of liquid reinforcing materials transmitted by a capillary phenomenon through two tapered projecting edges, the line-shaped gap being present on one side surface of the display panel.

In particular, the encapsulation apparatus constructed as an exemplary embodiment of the present invention may effectively and easily fill a gap, particularly a gap in a corner portion, of display panel 50 with reinforcing material 40 and may also improve hermeticity of the display panel minimizing generation of bubbles between a seal and a reinforcing material, or in the reinforcing material when the gap is filled with the reinforcing material. For the purpose of giving such effects, a main characteristic of the encapsulation apparatus of the present invention is a configuration of injection part 10.

More particularly, injection part 10 includes a header 13 having tapered projecting edges 11a, 11b formed in one end thereof; and a neck 14 extended integrally from projecting edges 11a, 11b and coupling injection part 10 and supporter 20. Header 13 of injection part 10 includes two projecting edges 11a, 11b and a recess 12 disposed between projecting edges 11a, 11b, and neck 14 includes a coupling hole (not shown) passed through a coupling unit such as a bolt 22 when neck 14 is coupled to supporter 20.

A length (W1) of header 13 increases proportionately with an increasing length (W2) of a corresponding side surface 51 of a display panel 50, and a length (W1) of header 13 decreases proportionately with an decreasing length (W2) of a corresponding side surface 51 of a display panel 50. Projecting edges 11a, 11b may include additional projecting edges with an increasing length of side surface 51 of display panel 50. The length of projecting edges 11a, 11b however may be optionally adjusted according to the viscosity or amount of the injected reinforcing material, but the position of projecting edges 11a, 11b is preferably disposed in a roughly fixed position in proportion to the length of side surface 51, as described in the case that the projecting edges are coupled to the header so that the projecting edges are disposed in a position from approximately ⅓ to approximately ⅔ in a longitudinal direction of side surface 51 of display panel 50 if the number of projecting edges are two.

Figure 1B:
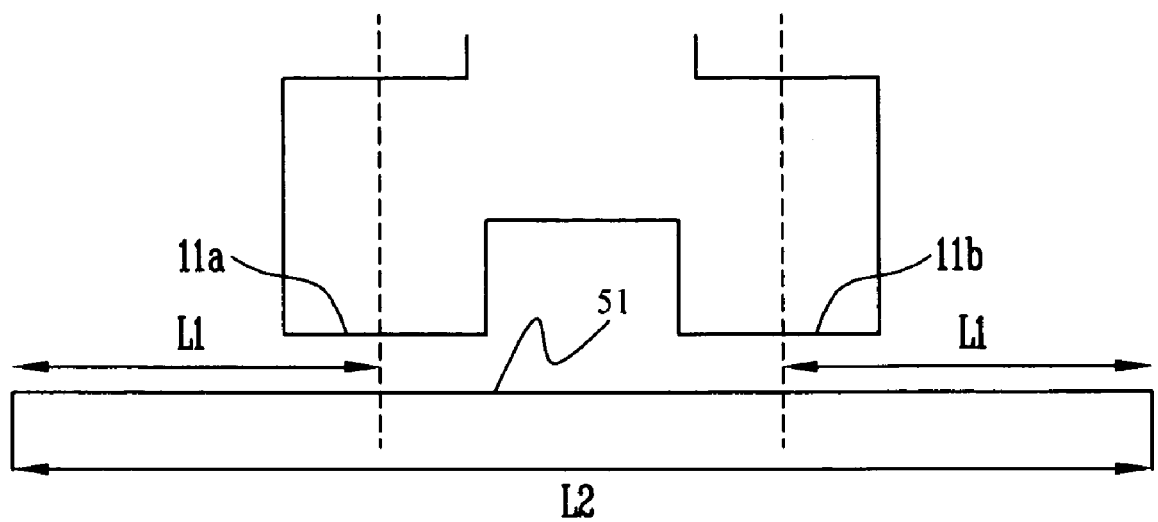
FIG. 1B is a partially schematic side view of the encapsulation apparatus as shown in FIG. 1A for illustrating the relative positions between tapered projection edges and side surface of the display device.

FIG. 1B is a partially schematic side view of the encapsulation apparatus as shown in FIG. 1A for illustrating the relative positions between tapered projection edges and side surface of the display device. In FIG. 1B, L1 indicates the position of tapered projecting edges 11a and 11b and L1 is measured from the edges of side surface 51 of display panel to central line of one of tapered projecting edges 11a and 11b, and L2 is total width W2 of side surface 51 of display panel. Here, L1 is approximately (⅓)L2 and therefore projecting edges 11a and 11b are evenly distributed on side surface 51 of display panel and thus evenly being distributed at the edges of display panel.

This is for suitably injecting a gap in a corner portion of display panel 50 with a reinforcing material, and also minimize generation of bubbles when the gap is injected with the reinforcing material.

Supporter 20 supports injection part 10 and may include a unit for transferring injection part 10, if necessary. Supporter 20 may include a hole (not shown) or a groove to couple with a neck 14 of injection part 10, and supporter 20 may be coupled to injection part 10 using the coupling unit.

Figure 2:
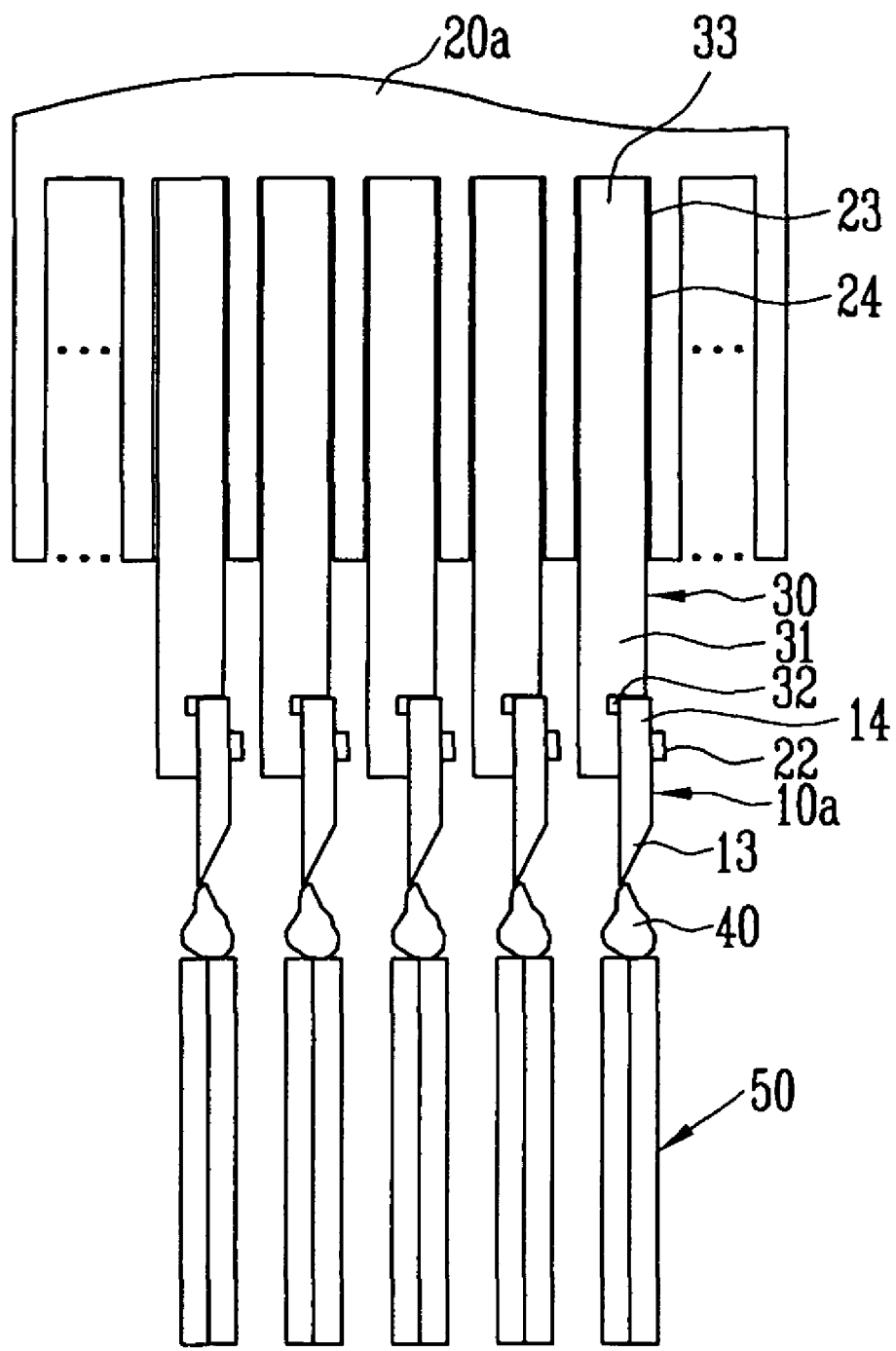
FIG. 2 is a schematic view showing an encapsulation apparatus constructed as another exemplary embodiment of the present invention.
Figure 3:
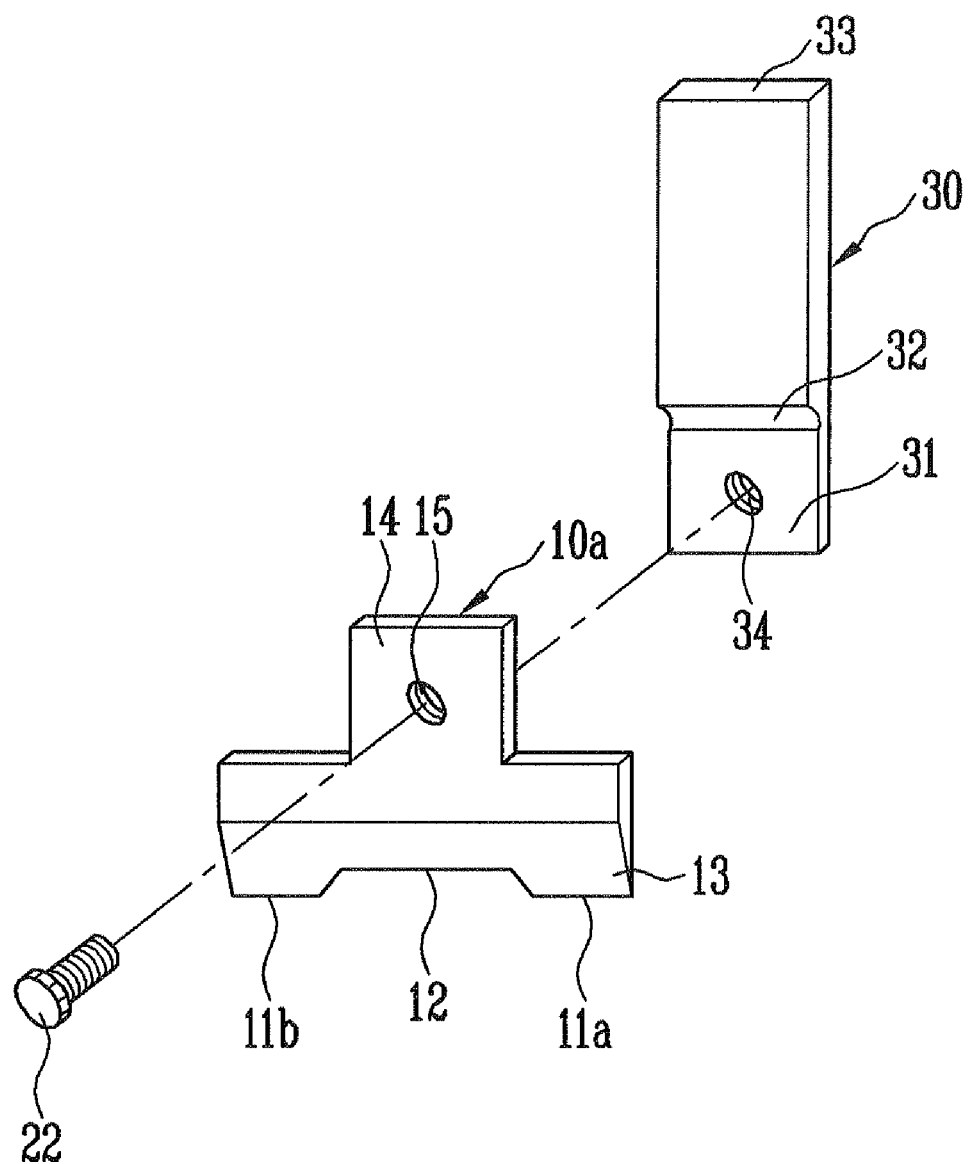
FIG. 3 is an exploded perspective view showing some of components of the encapsulation apparatus as shown in FIG. 2.

FIG. 2 is a schematic view showing an encapsulation apparatus constructed as another exemplary embodiment of the present invention, and FIG. 3 is an exploded perspective view showing some of components of the encapsulation apparatus as shown in FIG. 2.

Referring to FIGS. 2 and 3, the encapsulation apparatus includes an injection part 10a, a supporter 20a and a body 30 for coupling injection part 10a in an attachable/detachable manner.

Injection part 10a illustrates a shape as seen from a left side of injection part 10 as shown in FIG. 1, and has a knife shape having a pointed end. That is to say, injection part 10a has a tapered shape in which a cross-sectional area is decreased in a direction from neck 14 to projecting edges 11a (11b when viewed from another side).

Body 30 includes one end portion 31 coupled with neck 14 of injection part 10a by means of the coupling unit such as a bolt 22, and other end portion 33 of body 30 fits into a groove 23 of supporter 20a. One end portion 31 includes a stepped portion 32 where body 30 having a plate shape has a decreasing thickness; and a coupling hole 34 for coupling body 30 with injection part 10a. Stepped portion 32 facilitates the coupling with injection part 10a by partially defining a position of injection part 10a when stepped portion 32 is coupled with injection part 10a. Coupling hole 34 may include a screw thread in an inside surface and be coupled to a bolt 22 passed through coupling hole 15 of injection part 10a.

Supporter 20a includes grooves 23 for coupling with the other end portion 33 of body 30 in an attachable/detachable manner; a fixing member 24 is installed on the inside surface of groove 23. Groove 23 is formed so that the other end portion 33 of body 30 is inserted into groove 23 in a predetermined length, and a plurality of grooves may be installed as one group so as to reinforce a plurality of display panels 50 at the same time. Fixing member 24 fixes injection part 10a in groove 23 so that injection part 10a inserted into groove 23 cannot be inclined or easily removed. In this embodiment, fixing member 24 may be an elastic member installed in a predetermined region of the inside surface of groove 23. After the protrusion or insertion, contemporary fixation structures such as rotary structures may be sued as fixing member 24.

In order to enhance the effect of the injection the reinforcing material, supporter 20a may also be operated so that injection part 10a can sway left and right as much as a predetermined distance along a direction where a gap of display panel 50 is extended. Construction for obtaining the effects may be easily designed and produced by those having ordinary skills in the art, and therefore description of the construction is omitted for clarity. If injection part 10a sways left and right, the reinforcing material injected into the gap of display panel 50 may be uniformly and evenly injected into the gap of display panel 50.

When the above-mentioned encapsulation apparatus is used herein, a gap, particularly a gap including a corner portion, between the substrate and the encapsulation substrate is effectively 11 filled by the reinforcing material if the encapsulation substrate is in a cap shape as well as a plate shape, and its hermeticity may be improved by minimizing generation of bubble when the gap is injected with a reinforcing solution, thereby preventing penetration of the external air.

Figure 4:
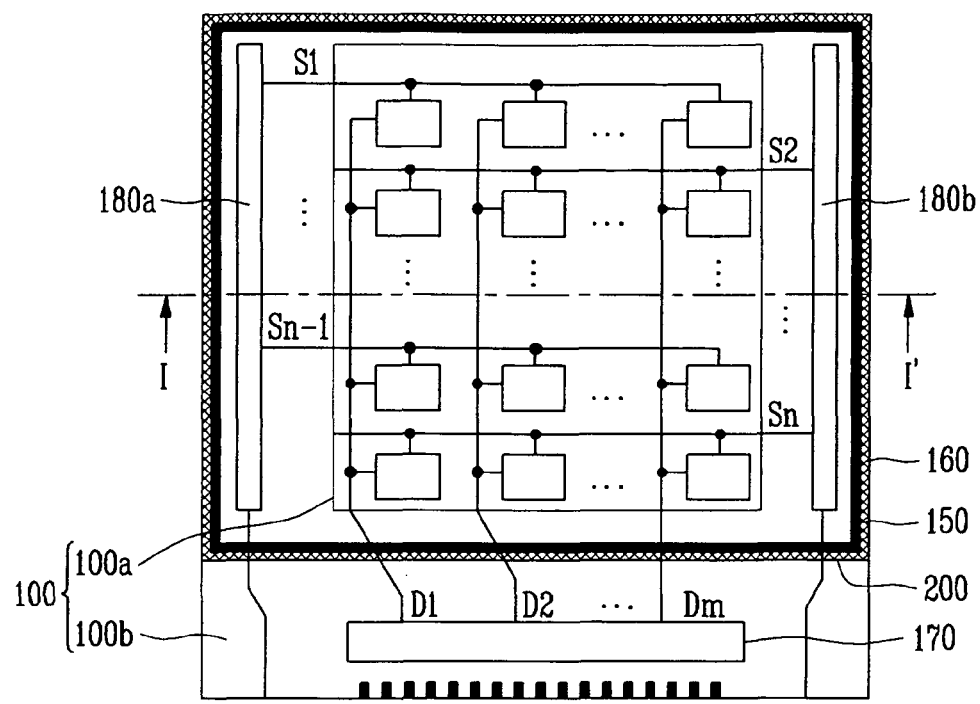
FIG. 4 is a plane mimetic view showing an organic light emitting display device manufactured using the encapsulation apparatus constructed as another exemplary embodiment of the present invention.

Next, the method of manufacturing an organic light emitting display device having high durability using the encapsulation apparatus of the present invention will be described in detail. FIG. 4 is a plane mimetic view showing the organic light emitting display device manufactured using the encapsulation apparatus of the present invention.

Referring to FIG. 4, the organic light emitting display device includes a substrate 100, an encapsulation substrate 200, a sealing agent 150 and a reinforcing material 160. In this embodiment, the organic light emitting display device is realized in an active matrix mode.

Substrate 100 includes a pixel region 100a having at least one organic light emitting diode formed therein; and a non-pixel region 100b including a region except for pixel region 100a. Pixel region 100a means a region that displays a predetermined image using the light emitted from the organic light emitting diode.

Pixel region 100a includes a plurality of scan lines (S1 to Sn) arranged in a first direction, for example a row direction; and a plurality of data lines (D1 to Dm) arranged in a second direction, for example a column direction, that is crossed at a right angle with the first direction, wherein a plurality of pixels are disposed in a region defined by the scan lines (S1 to Sn) and the data lines (D1 to Dm), and an organic light emitting diode in each of the pixels is driven by a data signal and a scan signal, the data signal being applied through the data lines (D1 to Dm) and the scan signal being applied through the scan lines (S1 to Sn).

Non-pixel region 100b includes metal wires for extending scan lines (S1 to Sn) and data lines (D1 to Dm) in pixel region 100a, respectively; and a driver integrated circuit coupled to the metal wire. Here, the driver integrated circuit includes a data driver 170 coupled to the data lines (D1 to Dm); and scan drivers 180a, 180b coupled to the scan lines (S1 to Sn).

Figure 5:
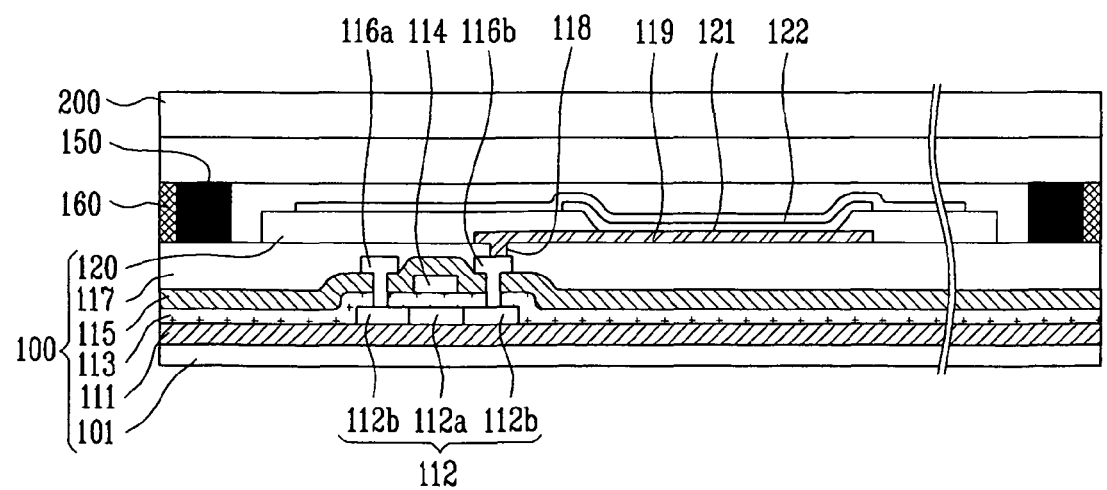
FIG. 5 is a cross-sectional view showing main parts of the organic light emitting display device as shown in FIG. 4.

The main components of the above-mentioned organic light emitting display device according to the present invention will be described in more details with reference to FIGS. 4 and 5. FIG. 5 is a cross-sectional view showing main parts of the organic light emitting display device as shown in FIG. 4. FIG. 5 corresponds to the cross-sectional view taken from a line I-I' of FIG. 4, and descriptions of related known functions or construction that are considered to depart from the gist of the present invention are omitted for clarity. In addition, the thickness and size as shown in FIG. 5 may be overstated for convenience, and the actual thickness or size of a film may be different.

A buffer layer 111 is formed on an evaporation substrate 101. Buffer layer 111 prevents substrate 100 from being damaged by factors such as heat from the exterior, etc., and may be formed of electrically insulated materials such as silicon dioxide ($SiO_2$) and silicon nitride (SiNx).

A semiconductor layer 112 having an active layer 112a and an ohmic contact layer 112b is formed on at least some region of buffer layer 111. A gate dielectric layer 113 is formed on buffer layer 111 and semiconductor layer 112. A gate electrode 114 is formed on at least some region of gate dielectric layer 113 to correspond to active layer 112a. An interlayer dielectric layer 115 is formed on gate electrode 114 and gate dielectric layer 113. Source and drain electrodes 116a, 116b are formed on interlayer dielectric layer 115. Source and drain electrode 116a, 116b are formed so that they can be coupled respectively to one exposed region of ohmic contact layer 112b. An overcoat 117 is formed on interlayer dielectric layer 115 and source and drain electrodes 116a, 116b. A first electrode 119 is formed on one region of overcoat 117. first electrode 119 is coupled to an exposed region of at least one source and drain electrodes 116a, 116b through via hole 118.

A pixel definition layer 120 is formed on overcoat 117 and first electrode 119, pixel definition layer 120 having an opening (not shown) for exposing at least some region of first electrode 119. An organic layer 121 is formed on the opening of pixel definition layer 120. A second electrode 122 is formed on pixel definition layer 120 and organic layer 121. A passivation layer is further formed on second electrode 122.

Encapsulation substrate 200 is a member for encapsulating at least one pixel region of substrate 100 having an organic light emitting diode formed therein. In this case, encapsulation substrate 200 may be formed of transparent materials for top emission or dual emission, and alternatively, may be formed of and opaque materials for bottom emission. In the present invention, glass may be used as the materials of encapsulation substrate 200, but there is no limitation to materials if they may encapsulate a pixel region in addition to the glass.

Encapsulation substrate 200 has a plate shape and encapsulates pixel region 100a on substrate 100. In this embodiment, the entire region except for a data driver 170 and a pad portion is encapsulated.

Sealing agent 150 is formed on substrate 100 and an edge of encapsulation substrate 200 to encapsulate the entire pixel region 100a and some of non-pixel region 100b so that the display panel is not penetrated. Sealing agent 150 is preferably formed in a linear shape and is spaced apart at a constant distance from edges of a surface formed by adhering encapsulation substrate 200 to substrate 100. This is to ensure a space for injecting reinforcing material 160, and the spaced distance is preferably in a range from 0.3 mm to 0.7 mm. If the spaced distance is less than 0.3 mm, a reinforcing effect may deteriorate due to the narrow width of reinforcing material 160; if the spaced distance is more than 0.7 mm, the size of the product is increased due to the wide dead space which may lead to the deteriorated quality of the product.

Sealing agent 150 is so called "frit" or "glass frit (glass frit)", and may be made of frit materials including fine glass particles. The flit basically means a raw glass material in the form of powder including an additive material, and the frit practically means a glass in the field of glass since the frit is melted and formed into a glass. Therefore, all kinds of the frit including the glass may be used in this specification. The above-mentioned fine glass particles include at least one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate. The fine glass particle has a particle size of approximately 2 μm to 30 μm, more preferably, approximately 5 μm to about 10 μm. The present invention is however not particularly limited thereto. If a distance between the encapsulation substrate and the substrate which are connected to each other by the frit, or a distance between any layers on the encapsulation substrate and the evaporation substrate is increased, the size of the fine glass particles may be further increased as much as the increased distance.

The frit may further include a filler or additive material for controlling an absorption characteristic for irradiated energy or controlling thermal expansion characteristic. Also, the frit may include inversion and/or addition fillers for controlling a thermal expansion coefficient. The filler or additive material includes transition metals such as chromium (Cr), iron (Fe), magnesium (Mn), cobalt (Co), copper (Cu), and/or vanadium. Also, the additive material may include $ZnSiO_4$, $PbTiO_3$, $ZrO_2$, and/or eucryptite ($Li_2O—Al_2O_3—2SiO_2$).

If substrate 100 and encapsulation substrate 200 are adhered to each other using the frit, the frit, in the form of frit paste, is applied at an edge of encapsulation substrate 200, melted between substrate 100 and encapsulation substrate 200 using a laser or ultraviolet rays, and then the substrate 100 and encapsulation substrate 200 are sealed by the frit while the frit is cured. Meanwhile, if the encapsulation process is started with dried frit, a liquid material may be further used. An organic or inorganic solvent may be sued as the liquid material.

A line formed using the frit materials is preferably in a width range from 0.5 to 1.5 mm. If the width of the line is less than 0.5 mm, a large amount of poor lines may be formed in the sealing process, and an adhesive force may be reduced. If the width of the line exceeds 1.5 mm, quality of the final product may be deteriorated due to the increased dead space of the final product.

Meanwhile, the present invention is not particularly limited to the materials or layers of a surface of substrate 100 that is in direct contact with the frit, but the frit is preferably installed so that it may be overlapped with a metal wire as possible as it can, except for a zone of the metal wire coupled to the driver integrated circuit. If the frit is overlapped with the metal wire, the metal wire may be damaged when the frit is cured by irradiation of a laser or ultraviolet rays.

Reinforcing material 160 is formed so that it may be in contact with sealing agent 150 and embraces sealing agent 150, or be spaced apart from sealing agent 150 at a predetermined distance. Reinforcing material 160 functions to reinforce strength of sealing agent 150 such as flit while enhancing a sealing force of sealing agent 150. Reinforcing material 160 is installed in a gap formed between substrate 100 and encapsulation substrate 200, and may be additionally disposed on side surface of substrate 100 or encapsulation substrate 200.

Materials of reinforcing material 160 may be initially applied in a form of liqid phase between substrate 100 and encapsulation substrate 200, and therefore resins that are naturally cured, thermally cured, or cured by ultraviolet rays, may be used as materials of reinforcing material 160. For example, acrylcyanoate may be used as the naturally cured materials, acrylate may be used as thermally cured materials, and epoxy, acrylate and urethane acrylate may be used as the ultraviolet rays-cured materials. Acrylate may be thermally cured at a temperature of less than 80° C.

If the above-mentioned reinforcing material 160 is used, particularly if substrate 100, encapsulation substrate 200 and sealing agent 150 are all made of glass, reinforcing material 160 may prevent a display device from being easily broken by external impacts, and enhance the sealing in a region where sealing agent 150 is not fused and attached, or a region having a weak adhesive force.

Components of the above-mentioned organic light emitting display device and coupling relations between them may be widely varied according to the structure, for example the active matrix or passive matrix structure of the organic light emitting display, and description of the general structure of the organic light emitting display device omitted for clarity since the general structure is known.

Next, the method of manufacturing an organic light emitting display device according to an exemplary embodiment of the present invention will be described in detail. FIGS. 6A to 6D are flow process charts showing a method of manufacturing an organic light emitting display device according to an exemplary embodiment of the present invention. Hereinafter, one case that a frit is used as a sealing agent 150 is, for example, described herein.

Figure 6A:
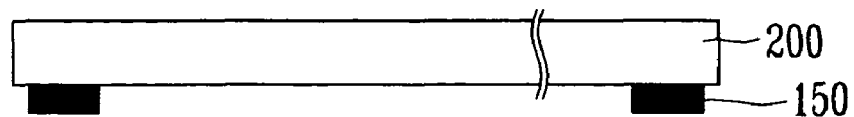
FIGS. 6A to 6D are process flow charts showing a method of manufacturing an organic light emitting display device constructed as an exemplary embodiment of the present invention.

First, frit is applied in a line shape as sealing agent 150 in a position spaced apart at a predetermined distance from an edge of encapsulation substrate 200, as shown in FIG. 6A. The frit is applied in the form of frit paste to encapsulation substrate 200, and then cured. As described above, it is desirable that the frit has a height of 10 μm to 20 μm. If the thickness of the frit exceeds 20 μm, a relatively large amount of energy is required for melting a large amount of frit when substrates are sealed with a laser, and therefore a power of the laser should be increased or a scan speed should be reduced, which leads to the damage to the display device by the generated heat, whereas a large amount of the frit may be poorly applied if the thickness of the frit is less than 10 µm. These steps are shown in FIG. 6A.

Figure 6B:
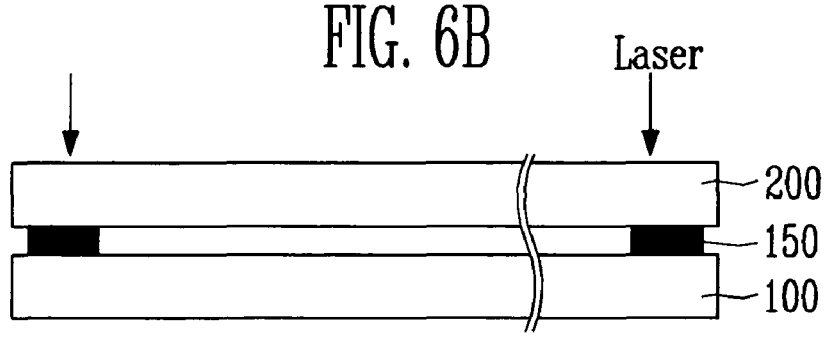

Next, as shown in FIG. 6B substrate 100 including a pixel region having an organic light emitting diode and a non-pixel region having a driver integrated circuit and a metal wire is prepared, and an encapsulation substrate 200 is closely physically attached onto the prepared substrate 100. And, the frit between the closely attached substrate 100 and encapsulation substrate 200 is irradiated with a laser or infrared rays and melted. At this time, laser or infrared rays with which the frit is irradiated preferably has a wavelength within a range of from approximately 800 nm to approximately 1200 nm, and more preferably approximately 810 nm, and a power of the laser or infrared rays may be used at the power range of from 25 watts to 45 watts. During the frit is irradiated with the laser or infrared rays, a region except for the frit is preferably covered by a mask in order to be prevented from the irradiation of the laser or infrared rays. Materials of the mask, which may be used herein, include copper, aluminum, or bilayers thereof. Then, the molten frit is cured while removing off moisture or an organic binder, thereby adhering encapsulation substrate 200 to substrate 100. These steps are shown in FIG. 6B.

Figure 6C:
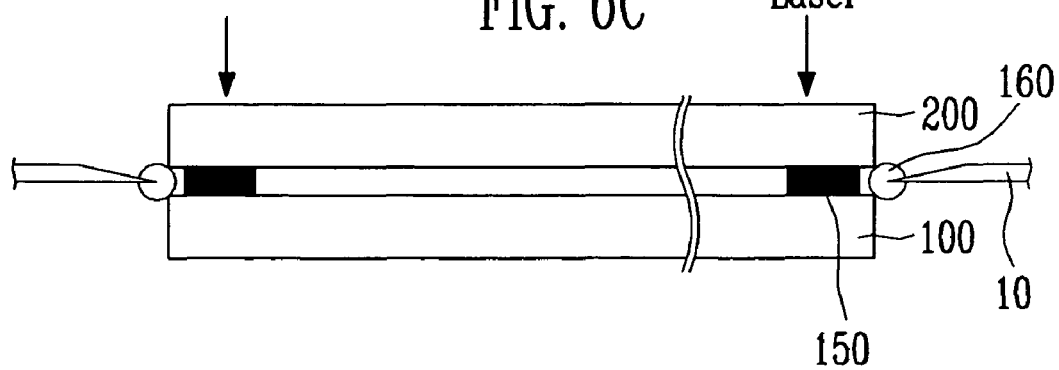

Next, as shown in FIG. 6C, the previously mentioned injection part 10 of the encapsulation apparatus costructed as the present invention is immersed in a container containing a liquid reinforcing material and is taken out of the liquid reinforcing material, and liquid reinforcing material 160 collected in the projecting edges of injection part 10 is disposed in an external portion of the frit, namely a gap of the display panel having substrate 100 and encapsulation substrate 200 adhered to each other. At this time, liquid reinforcing material 160 is naturally penetrated into the gap by a capillary phenomenon. Viscosity of liquid reinforcing material 160 is preferably in a range from 100 cp(CentiPoises) to 4000 cp(CentiPoises). If the viscosity of liquid reinforcing material 160 falls out of the above defined range, liquid reinforcing material 160 may not suitable for usage since it is too watery or too thick. These steps are shown in FIG. 6C.

For the above-mentioned procedural steps, the injection part having tapered projecting edges formed in both sides of one end thereof is designed to supply the reinforcing material into two spots on one edge of the display panel so as to minimize generation of bubbles and effectively reinforce a corner portion, and therefore the shape, width, thickness of the injection part, the number of the projecting edge, and the range of an inclined angle in a tapered region may be designed according to the size of the display panel.

Also, if the reinforcing material is injected into gaps at two or three edges of the display panel except for the edge where the pad portion is disposed, two or three injection parts may be installed on an apparatus for injecting the reinforcing material.

The projecting edges of injection part 10 may be adjacent to, or in contact with the side surface or gap of the display panel. And, an amount of injected reinforcing material 160 may be determined according to the distance between injection port 10 and the display panel or to the amount of reinforcing material 160 penetrated into the gap.

Meanwhile, in this process, the injection part may sway left and right in a line direction where a gap is formed to inject the reinforcing material more effectively. In this case, the reinforcing material may be injected uniformly even when a line of the gap is slightly bent, as well as the gap is straightly formed.

Figure 6D:
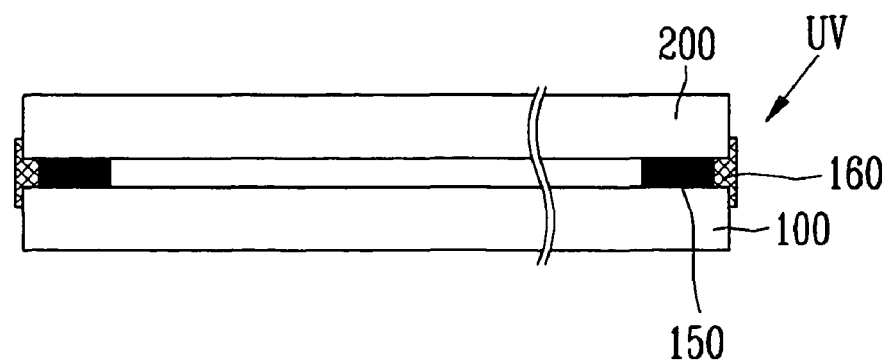

Next, reinforcing material 160 is cured. As shown in FIG. 6D, the curing of reinforcing material 160 may be carried out using the naturally curing process. Meanwhile, the curing of reinforcing material 160 may be cured by irradiation of ultraviolet rays. Of course, reinforcing material 160 exposed to some areas of substrate 100 and a side surface of encapsulation substrate 200 may be removed. These steps are shown in FIG. 6D.

In accordance the manufacturing method, since the reinforcing material is disposed into a gap of the display panel by means of a capillary phenomenon, the encapsulation process or the reinforcement process may be easily carried out during the injection process of the reinforcing material, using the above-mentioned encapsulation apparatus of the present invention. In particular, it is possible to minimize generation of bubbles in the penetration of reinforcing material 160 while securely sealing even a corner portion of the display panel by employing the injection part of the encapsulation apparatus having tapered projecting edges.

Also, the above-mentioned method of manufacturing an organic light emitting display device has advantages that the reinforced encapsulation process may be easily carried out regardless of the structure, such as an active matrix mode or a passive matrix mode, of the organic light emitting display, or the shape, such as a cap shape, of the encapsulation substrate.

The method according to the present invention may be useful to improve hermeticity by surely filling the entire gap between the substrates, including a corner portion of the display panel, with the reinforcing material. In addition, the method according to the present invention may be useful to minimize generation of bubbles when the reinforcing material is injected into a gap.

Also, since a gap between a substrate and an encapsulation substrate of the organic light emitting display device is hermetically sealed using the encapsulation apparatus, it is possible to improve impact resistance of the encapsulation apparatus, as well as a life span and luminous efficiency characteristic of the encapsulation apparatus by suppressing the penetration of hydrogen, oxygen and moisture.

Although exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. An encapsulation apparatus, comprising:
   an injection part having tapered projecting edges formed at one end of the injection part, with a cross-section of each tapered projecting edge having a pointed distal end, the injection part applying a reinforcing material between two substrates of a display panel;
   a supporter being physically coupled to the injection part and supporting the injection part; and
   a unit generating rays for curing the reinforcing material.

2. The encapsulation apparatus according to claim 1, in which the injection part has a recess between the tapered projecting edges.

3. The encapsulation apparatus according to claim 1, in which the injection part comprises a header comprising the tapered projecting edges formed in the one end of the injection part; and a neck being extended integrally from the projecting edges and coupling the injection part to the supporter.

4. The encapsulation apparatus according to claim 3, in which the neck is coupled to the supporter by a screw.

5. The encapsulation apparatus according to claim 3, in which the header has a length corresponding to that of a corresponding side surface of the display panel.

6. The encapsulation apparatus according to claim 1, in which lengths of the tapered projecting edges are determined according to a viscosity or an amount of the reinforcing material to be injected.

7. The encapsulation apparatus according to claim 1, in which, when two projecting edges are formed in each projecting port, the projecting edges are coupled to the header so that the projecting edges are disposed in a position from approximately $1/3$ of a width of a corresponding side surface to approximately $2/3$ of the width of the corresponding side surface in a longitudinal direction along the corresponding side surface of the display panel.

8. The encapsulation apparatus according to claim 1, further comprising a body being coupled to the injection part, the body coupling the injection part to the supporter in an attachable/detachable manner.

9. An encapsulation apparatus, comprising:
   at least one injection part having a predetermined number of tapered projecting edges formed at one end of the injection port, with a cross-section of each tapered projecting edge having a pointed distal end, the injection part applying a reinforcing material between two substrates of a display panel;
   at least one supporter being physically coupled to the at least one injection part and supporting the at least one injection part; and
   a unit generating rays for curing the reinforcing material.

10. The encapsulation apparatus of claim 9, with the at least one injection part having a recess between the projecting edges.

* * * * *